(12) United States Patent
Yang et al.

(10) Patent No.: US 10,991,308 B2
(45) Date of Patent: Apr. 27, 2021

(54) DISPLAY PANEL AND DISPLAY DEVICE

(71) Applicant: BOE TECHNOLOGY GROUP CO., LTD., Beijing (CN)

(72) Inventors: Ming Yang, Beijing (CN); Minghua Xuan, Beijing (CN); Can Zhang, Beijing (CN); Xiandong Meng, Beijing (CN); Xiaochuan Chen, Beijing (CN); Wenqing Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/547,820

(22) Filed: Aug. 22, 2019

(65) Prior Publication Data

US 2020/0279531 A1 Sep. 3, 2020

(30) Foreign Application Priority Data

Feb. 28, 2019 (CN) .......................... 201910150824.X

(51) Int. Cl.
*G09G 3/3258* (2016.01)
*G09G 3/3266* (2016.01)
*H01L 27/32* (2006.01)

(52) U.S. Cl.
CPC ......... *G09G 3/3258* (2013.01); *G09G 3/3266* (2013.01); *H01L 27/3262* (2013.01); *H01L 27/3265* (2013.01); *G09G 2300/0426* (2013.01)

(58) Field of Classification Search
CPC ............... G09G 3/3258; G09G 3/3266; G09G 2300/0426; H01L 27/3265; H01L 27/3262
See application file for complete search history.

(56) References Cited

U.S. PATENT DOCUMENTS

| 9,634,075 | B2 | 4/2017 | Chung et al. |
| 9,735,208 | B2 | 8/2017 | Lee et al. |
| 10,186,567 | B2 | 1/2019 | Jeong et al. |
| 2011/0272675 | A1 | 11/2011 | Chung et al. |
| 2018/0190747 | A1* | 7/2018 | Son ..................... H01L 27/3267 |
| 2018/0366058 | A1* | 12/2018 | Gu ........................... G09G 3/20 |

FOREIGN PATENT DOCUMENTS

| CN | 103219355 A | 7/2013 |
| CN | 104376811 A | 2/2015 |
| CN | 105529351 A | 4/2016 |
| CN | 108628024 A | 10/2018 |
| WO | 2018/171261 A1 | 9/2018 |

OTHER PUBLICATIONS

Chinese Office Action in Chinese Application No. 201910150824.X, dated Jun. 1, 2020 with English translation.

* cited by examiner

*Primary Examiner* — Vinh T Lam
(74) *Attorney, Agent, or Firm* — Collard & Roe, P.C.

(57) ABSTRACT

A display panel and a display device are provided. The display panel includes a plurality of pixel regions, each pixel region including a pixel island and a transparent region located on a periphery of the pixel island. The pixel island includes K active display area, a distance between adjacent ones of the K active display area in the pixel island is less than a distance between pixel islands of adjacent ones of the plurality of pixel regions. Each of the plurality of pixel regions includes K sub-regions with approximately equal areas, K pixel driving circuits are respectively disposed in the K sub-regions, the K pixel driving circuits are configured to respectively drive the K active display areas, and the K is an integer greater than or equal to 2.

19 Claims, 5 Drawing Sheets

DISPLAY PANEL AND DISPLAY DEVICE

The present application claims priority to Chinese patent application No. 201910150824.X, filed on Feb. 28, 2019, the entire disclosure of which is incorporated herein by reference as part of the present application.

TECHNICAL FIELD

At least one embodiment of the present disclosure relates to a display panel and a display device.

BACKGROUND

With continuous development of the display technology, the augmented reality (AR) technology has a wide application prospect in the fields of games, medical treatment, shopping and so on because of its excellent human-computer interaction experience. The augmented reality technology can provide users with more external world information without affecting the interaction between users and the external world, thereby enhancing the information finally obtained by users.

In general, a device used in the augmented reality technology needs to have a capacity that a part of the device can transmit light while the other part of the device has a display function. Thus, more and more manufacturers are committed to developing transparent display products and using transparent screens to realize the augmented reality technology.

SUMMARY

At least one embodiment of the present disclosure provides a display panel, the display panel comprises a plurality of pixel regions, each of the plurality of pixel regions comprising a pixel island and a transparent region located on a periphery of the pixel island. The pixel island comprises K active display areas, a distance between adjacent ones of the K active display areas in the pixel island is less than a distance between the pixel islands in adjacent ones of the plurality of pixel regions, each of the plurality of pixel regions comprises K sub-regions with approximately equal areas, K pixel driving circuits are respectively disposed in the K sub-regions, the K pixel driving circuits are configured to respectively drive the K active display areas, and the K is an integer greater than or equal to 2.

For example, in a display panel provided by an embodiment of the present disclosure, in the pixel island, the K active display areas are arranged in an array; and in each of the plurality of pixel regions, the K sub-regions are arranged in an array.

For example, in a display panel provided by an embodiment of the present disclosure, in the pixel island, the K active display areas are arranged in a matrix of M*N, the K sub-regions are also arranged in a matrix of M*N, K=M*N, M and N are positive integers respectively, and at least one of M and N is greater than 1.

For example, in a display panel provided by an embodiment of the present disclosure, the pixel island is located in a center of a corresponding pixel region.

For example, in a display panel provided by an embodiment of the present disclosure, each of the K active display area comprises an active light emitting structure.

For example, in a display panel provided by an embodiment of the present disclosure, each of the plurality of pixel regions further comprises: K electrode leads, electrically connecting the K active display areas and the K pixel driving circuits in the transparent region respectively.

For example, in a display panel provided by an embodiment of the present disclosure, the K electrode leads do not cross each other.

For example, in a display panel provided by an embodiment of the present disclosure, each of the K electrode leads comprises a bending electrode lead, the bending electrode lead comprises: a first electrode lead, extending in a direction and connected with a corresponding active display area; and a second electrode lead, extending in another direction different from the direction in which the first electrode lead extends and connecting the first electrode lead with a corresponding pixel driving circuit.

For example, in a display panel provided by an embodiment of the present disclosure, each of the K electrode leads is the bending electrode lead.

For example, in a display panel provided by an embodiment of the present disclosure, each of the plurality pixel regions further comprises: a first signal line and a second signal line connected with each of the K pixel driving circuits.

For example, in a display panel provided by an embodiment of the present disclosure, the first signal line comprises at least one of a gate line and a reset line, and the second signal line comprises at least one of a data line and a source line.

For example, in a display panel provided by an embodiment of the present disclosure, each of the K pixel driving circuits is disposed in a position of a corresponding sub-region away from the pixel island.

For example, in a display panel provided by an embodiment of the present disclosure, an area of each of the K sub-regions is greater than that of each of the K pixel driving circuits.

For example, in a display panel provided by an embodiment of the present disclosure, each of the K pixel driving circuits comprises a thin film transistor.

For example, in a display panel provided by an embodiment of the present disclosure, the K pixel driving circuits are in the transparent region.

For example, in a display panel provided by an embodiment of the present disclosure, the distance between adjacent ones of the K active display regions in the pixel island is less than one third of the distance between the pixel islands in adjacent ones of the plurality of pixel regions.

For example, in a display panel provided by an embodiment of the present disclosure, in each of the plurality of pixel regions, positions of the K pixel driving circuits in corresponding sub-pixel regions are the same.

For example, in a display panel provided by an embodiment of the present disclosure, in the plurality of pixel regions, adjacent ones of the plurality of pixel regions are connected to each other so that the plurality of pixel regions are closely arranged.

For example, in a display panel provided by an embodiment of the present disclosure, the pixel island partially overlaps with the sub-pixel regions adjacent to the pixel island.

At least one embodiment of the present disclosure further provides a display device, comprising the display panel in any embodiment of the present disclosure.

BRIEF DESCRIPTION OF THE DRAWINGS

In order to more clearly illustrate technical solutions of embodiments of the present disclosure, drawings of the embodiments will be briefly described in the following. It is obvious that the described drawings in the following description are only related to some embodiments of the present disclosure, but are not limitative to the present disclosure.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to characterize any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
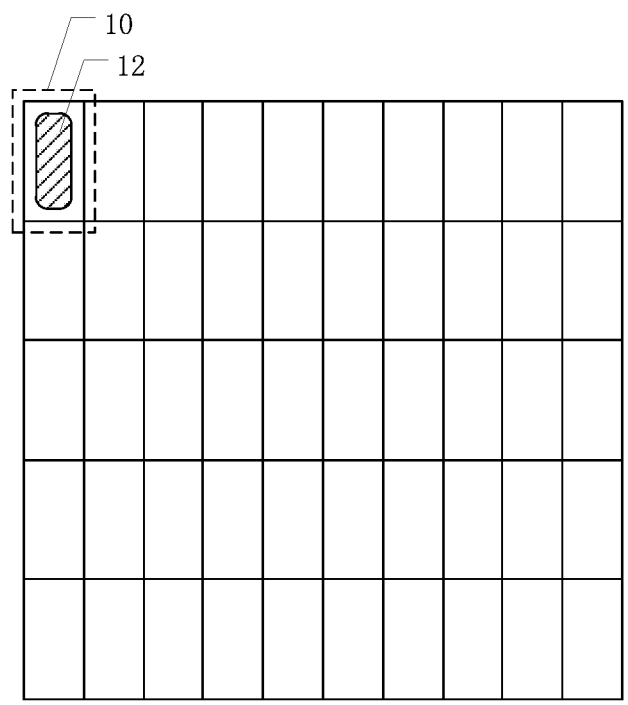
FIG. 1 is a planar view of a display panel.

FIG. 1 is a planar view of a display panel. As illustrated in FIG. 1, the display panel comprises a plurality of pixel regions 10, each pixel region 10 comprises an active display area 12 for light emitting display, and the active display area 12 can be regarded as a light emitting point. The active display area 12 occupies most of an area of the pixel region 10 and is surrounded by structures such as an opaque signal lines and a black matrix. Thus, the display panel does not have a capacity of partially transmitting light and is not suitable for the augmented reality technology.

Figure 2:
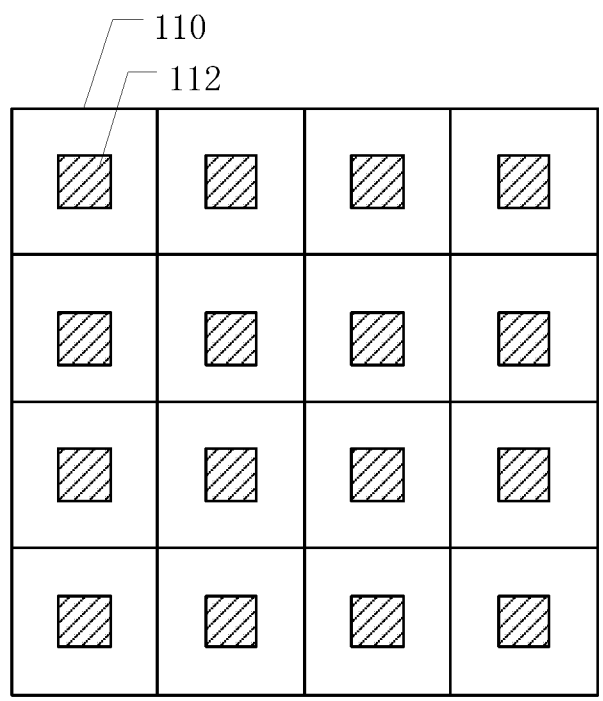
FIG. 2 is a planar view of another display panel.

FIG. 2 is a planar view of another display panel. As illustrated in FIG. 2, the display panel comprises a plurality of pixel regions 110, and each pixel region 110 comprises a pixel island 112 and a transparent region 114 located in a periphery of the pixel island 112. The pixel island 112 can be used for light emitting display, and the transparent region 114 has a capacity of transmitting light, therefore, the display panel can be suitable for the augmented reality technology. In general, the display panel is an active light emitting display panel, such as an organic light emitting diode (OLED) display panel. OLED has a problem of non-uniform threshold voltage, and a pixel driving circuit of a general OLED display panel needs to have a threshold voltage compensation function, which may result in that the pixel driving circuit of the OLED display panel comprises a plurality of components, for example, a plurality of switching transistors, capacitors and signal lines. Thus, a space occupied by the pixel driving circuit of the OLED display panel may be significantly increased, and even the area of the pixel driving circuit of the OLED display panel may be greater than that of the active display area.

Figure 3:
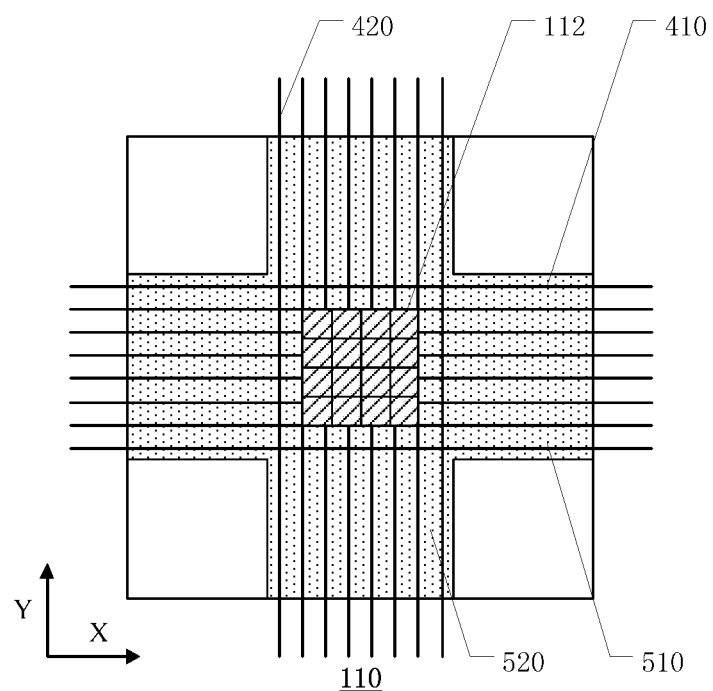
FIG. 3 is a planar view of one pixel region of the display panel illustrated in FIG. 2.

FIG. 3 is a planar view of one pixel region of the display panel illustrated in FIG. 2. As illustrated in FIG. 3, in the pixel region 110, the pixel island 112 comprises 16 active display areas as light emitting points, and the 16 active display areas are arranged in a matrix of 4*4. In this case, in order to drive the 16 active display areas in the pixel island 112 to emit light respectively, 16 pixel driving circuits electrically connected to the 16 active display areas are needed to drive the 16 active display areas to emit light respectively. An area of each pixel driving circuit is greater than that of each active display area, therefore, an area of the 16 pixel driving circuits is greater than an area of the pixel island 112. On the other hand, in order to drive the 16 active display areas in the pixel island 112 to emit light respectively, each pixel driving circuit needs to connect a horizontal signal line 410 extending in X direction and a vertical signal line 420 extending in Y direction in FIG. 3. Therefore, horizontal signal lines 410 of the 16 pixel driving circuits can form a horizontal signal line region 510, and vertical signal lines 420 of the 16 pixel driving circuits can form a vertical signal line region 520. The horizontal signal line region 510 and the vertical signal line region 520 can form a cross-shaped region. As illustrated in FIG. 3, in the horizontal signal line region and the vertical signal line region (the cross-shaped region illustrated in FIG. 3), density of opaque signal lines is relatively high, resulting in poor light transmittance of the horizontal signal line region and the vertical signal line region.

Figure 4:
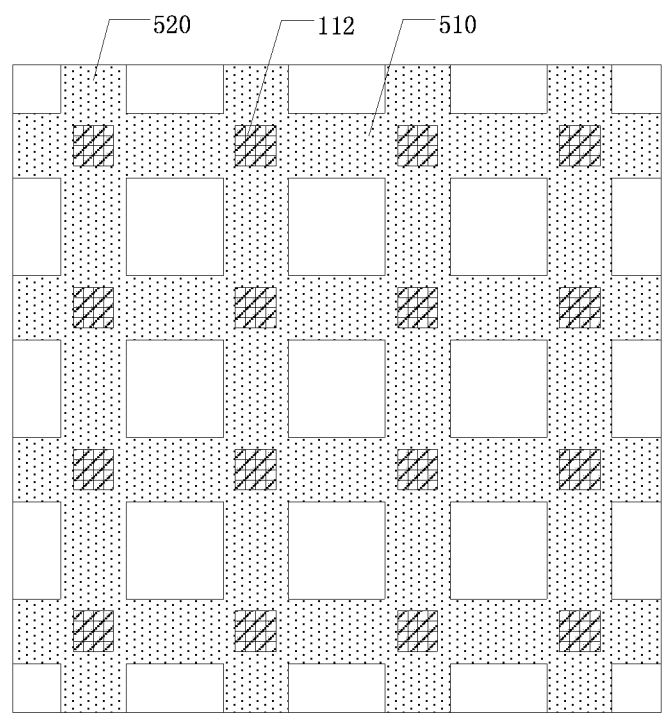
FIG. 4 is a schematic view of a horizontal signal line region and a vertical signal line region in a display panel.

FIG. 4 is a schematic view of a horizontal signal line region and a vertical signal line region in a display panel. As illustrated in FIG. 4, in a case where the display panel displays, especially the display panel is used as a near-eye display panel for displaying, the horizontal signal line region and the vertical signal line region have poor light transmittance, therefore, an obvious mesh-like dark region is easily formed on the display panel, thereby causing an obvious screen window effect, and further causing a poor display effect and a poor user experience.

Thus, embodiments of the present disclosure provide a display panel and a display device. The display panel comprises a plurality of pixel regions, each pixel region comprising a pixel island and a transparent region located on a periphery of the pixel island. The pixel island comprises K active display area, a distance between adjacent ones of the K active display area in the pixel island is less than a distance between pixel islands of adjacent ones of the plurality of pixel regions. Each of the plurality of pixel regions comprises K sub-regions with approximately equal areas, K pixel driving circuits are respectively disposed in the K sub-regions, the K pixel driving circuits are configured to respectively drive the K active display areas, and the K is an integer greater than or equal to 2. In the display panel, the K pixel driving circuits of the K active display areas in the pixel island of the pixel region are uniformly distributed in the pixel region, so that signal lines connected with pixel driving circuits are also uniformly distributed in the pixel region, thereby avoiding the formation of the abovementioned horizontal signal line region and the vertical signal line region having poor light transmittance, and improving the uniformity of light transmittance in the pixel region, so as to eliminate the screen window effect as mentioned above, improve the display effect and enhance the user experience.

A display panel and a display device provided by embodiments of the present disclosure are described below with reference to the drawings.

Figure 5A:
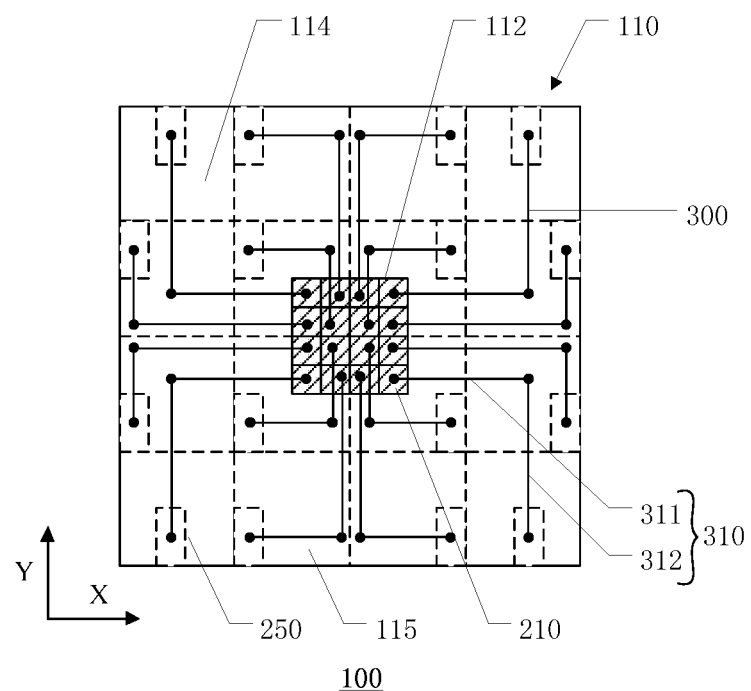
FIG. 5A is a planar view of a display panel provided by an embodiment of the present disclosure.

An embodiment of the present disclosure provides a display panel. FIG. 5A is a planar view of a display panel according to an embodiment of the present disclosure. The display panel 100 comprises a plurality of pixel regions 110, the plurality of pixel regions 110 can be closely arranged to form a display region of the display panel 100. For example, adjacent pixel regions are connected with each other so that they can be closely arranged. In order to clearly illustrate a structure within the pixel region, FIG. 5A only illustrates one pixel region 110. As illustrated in FIG. 5A, each pixel region 110 comprises a pixel island 112 and a transparent region 114 located in a periphery of the pixel island 112. The pixel island 112 comprises K active display areas 210, a distance between adjacent active display areas 210 in the pixel island 112 is less than a distance between pixel islands 112 in adjacent pixel regions 110. The pixel region 110 comprises K sub-regions 115 with approximately equal areas, K pixel driving circuits 250 are respectively disposed in the K sub-regions 115, the K pixel driving circuits 250 are configured to respectively drive the K active display areas 210 as mentioned above to emit light, and the K is an integer greater than or equal to 2. For example, each active display area 210 corresponds to one pixel driving circuit 250. It should be noted that, the abovementioned each active display area and the corresponding pixel driving circuit can form a minimum unit emitting light independently, such as a sub-pixel. The above mentioned "approximately equal" means that a difference in areas of different sub-regions does not exceed 20% of an average area of the sub-region. Furthermore, the distance between adjacent active display areas 210 in the pixel island 112 illustrated in FIG. 5A is zero, the embodiments of the present disclosure include but are not limited thereto, the distance between adjacent active display areas 210 in the pixel island 112 may not be zero, as long as the distance between adjacent active display areas 210 in the pixel island 112 is less than the distance between the pixel islands 112 in adjacent pixel regions 110. Because the plurality pixel regions 110 can be closely arranged to form a display region of the display panel, the distance between adjacent pixel islands may be twice a minimum distance between the pixel island and an edge of the pixel region where the pixel island is located.

For example, in some examples, the pixel island 112 is partially overlapped with the sub-regions adjacent to the pixel island 112. For example, as illustrated in FIG. 5A, the pixel island 112 partially overlaps with four sub-regions in the middle, but the embodiments according to the present disclosure are not limited thereto.

In the display panel provided by the embodiment, each pixel region 110 comprises the pixel island 112 and the transparent region 114, the pixel island 112 is provided with the active display area 210 for emitting light and displaying, and the transparent region 114 is not provided with the active display area 210, and is a light-transmitting region. Therefore, the pixel island 112 of the display panel can be used to emit light and display, and the transparent region 114 can transmit light, so that a user can observe a real scene on a side of the display panel away from the user. The display panel can be used in a field of augmented reality. The pixel region 110 comprises the K sub-regions 115 with approximately equal areas, the K pixel driving circuits 250 are respectively disposed in the K sub-regions 115, therefore, the K pixel driving circuits 250 of the K active display areas 210 in the pixel island 112 of the pixel region 110 are uniformly distributed in the pixel region 110, so that signal lines connected with the pixel driving circuits 250 are also uniformly distributed in the pixel region 110, thereby avoiding the formation of a signal line concentrated region having poor light transmittance, and improving the uniformity of light transmittance in the pixel region, so as to eliminate the screen window effect, improve the display effect and enhance the user experience.

Furthermore, the pixel driving circuit 250 can be disposed outside the pixel island, therefore, the active display area 210 in the pixel island 112 can be made smaller, so that the pixel island 112 with the same area can be provided with more active display areas, so as to be beneficial to improve the resolution or PPI (Pixel Per Inch) of the display panel.

It should be noted that, the sub-regions in the embodiment of the present disclosure are actually the division of the area of each pixel region, and are defined only for uniform distribution of the K pixel driving circuits of the K active display regions in the pixel region. Therefore, the sub-region can be the transparent region, and can also be the pixel island, or a portion of the sub-region is the transparent region, and another portion of the sub-region is the pixel island.

For example, in some examples, as illustrated in FIG. 5A, in each pixel island 112, the K active display areas 210 are arranged in an array. In each pixel region 110, the K sub-regions 115 are also arranged in an array. That is, the K active display regions 210 are distributed in the K sub-regions 115 arranged in an array, thereby further improving the uniformity of light transmittance in the pixel region, and eliminating the screen window effect, improving the display effect and enhancing the user experience.

For example, in some examples, the display panel can be an active light emitting display panel, each active display area comprises an active light emitting structure, such as an organic light emitting diode. Because the active light emitting structure does not need a backlight module, the structure of the display panel is simpler and the manufacturing cost is relatively low. It should be noted that, the active display panel provided by the embodiment of the present disclosure is not limited to organic light emitting diode display panel, but may also be other types of display panels, such as an electronic paper display panel.

For example, in some examples, the K active display regions 210 in each pixel island 112 are arranged in a matrix of M*N, and the K sub-regions 115 are also arranged in a matrix of M*N, K=M*N. For example, as illustrated in FIG. 5A, 16 active display areas are arranged in a matrix of 4*4, 16 sub-regions 115 are also arranged in a matrix of 4*4. M and N are positive integers respectively, and at least one of M and N is greater than 1.

For example, in some examples, a matrix arrangement direction of the active display areas 210 in each pixel island 112 is the same as that of the K sub-regions 115. For example, taking the matrix arrangement of M*N as an example, each row of the active display areas 210 comprises M active display areas, each column of the active display areas 210 comprises N active display areas, each row of the sub-regions 115 comprises M sub-regions, and each column of the sub-regions 115 comprises N sub-regions. The row direction of the active display area matrix is the same as the row direction of the sub-region matrix, and the column direction of the active display area matrix is the same as the column direction of the sub-region matrix.

Figure 5B:
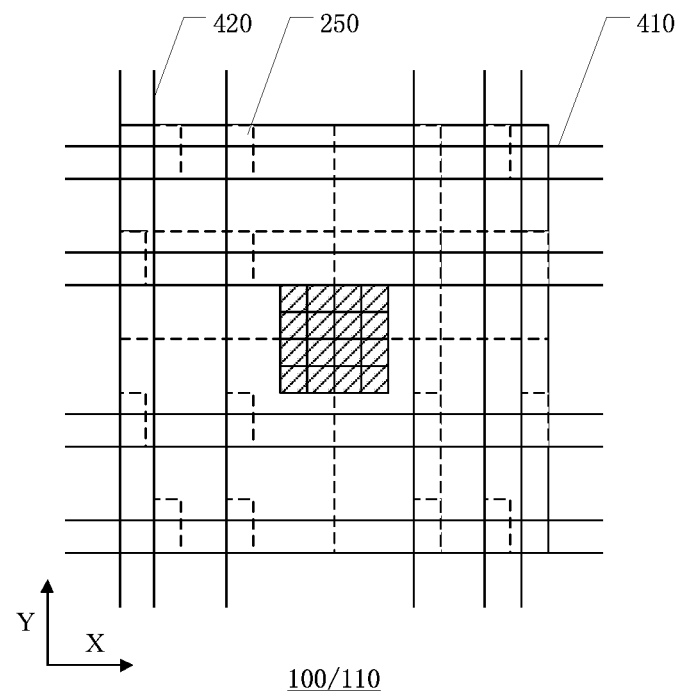
FIG. 5B is a distribution view of a first signal line and a second signal line of the display panel illustrated in FIG. 5A.

FIG. 5B is a distribution view of a first signal line and a second signal line in the display panel illustrated in FIG. 5A. As illustrated in FIG. 5B, the pixel region 110 further comprises a first signal line 410 and a second signal line 420 connected with each pixel driving circuit 250. As illustrated in FIG. 5B, because the K pixel driving circuits 250 of the K active display areas 210 in the pixel island 112 are uniformly distributed in the pixel region 110, so that the first signal line 410 and the second signal line 420 connected with the pixel driving circuits 250 are also uniformly distributed in the pixel region 110, thereby preventing the formation of a signal line concentrated region with poor light transmittance due to the excessively concentrated distribution of the first signal line 410 and the second signal line 420. Therefore, the display panel can improve the uniformity of light transmittance in the pixel region, so as to eliminate the screen window effect, improve the display effect and enhance the user experience.

For example, the first signal line 410 comprises at least one of a gate line and a reset line, and the second signal line 420 comprises at least one of a data line and a source line. Certainly, the embodiment of the present disclosure includes but is not limited thereto, the first signal line 410 and the second signal line 420 can also be other signal lines, which may be specifically set according to actual conditions.

For example, an extending direction of the first signal line 410 and an extending direction of the second signal line 420 cross each other. For example, the extending direction of the first signal line 410 and the extending direction of the second signal line 420 are perpendicular to each other.

For example, in some examples, as illustrated in FIG. 5A, each pixel island 112 is located in a center of the corresponding pixel region 110. Thus, the K pixel driving circuits corresponding to the K active display areas in the pixel island 112 can be uniformly dispersed around the pixel island 112. On one hand, the arrangement can improve the uniformity of light transmittance of the pixel region; on the other hand, the arrangement can reduce the density of electrode leads between the active display area in the pixel island and the corresponding pixel driving circuit, and reduce the wiring difficulty.

For example, in some examples, as illustrated in FIG. 5A, the pixel driving circuit 250 is disposed in the sub-region 115 at a position away from the pixel island 112, so as to further improve the uniformity of the light transmittance in the pixel region.

For example, in some examples, as illustrated in FIG. 5A, an area of each sub-region 115 is greater than that of each pixel driving circuit 250.

For example, in some examples, as illustrated in FIG. 5A, each pixel driving circuit 250 comprises a thin film transistor. Certainly, the pixel driving circuit 250 can also comprise other electronic components such as a capacitor.

For example, in some examples, the K pixel driving circuits 250 are located in the transparent region 114. A specific position of each pixel driving circuit 250 can be set according to the actual situation.

For example, in some examples, the distance between adjacent active display areas 210 in the pixel island 112 is less than one third of the distance between the pixel islands 112 in adjacent pixel regions 110.

For example, in some examples, as illustrated in FIG. 5A, each pixel region 110 further comprises: K electrode leads 300, connecting to the K active display areas 210 respectively, and connecting the K active display areas 210 and the K pixel driving circuits 250 in the transparent region 114, so as to ensure that each pixel driving circuit 250 can drive the corresponding active display area 210 to emit light and display.

For example, in some examples, as illustrated in FIG. 5A, the K electrode leads 300 are not cross each other, thereby facilitating wiring.

For example, in some examples, as illustrated in FIG. 5A, the K electrode leads 300 comprise a bending electrode leads 310, the bending electrode leads 310 comprises: a first electrode lead 311, extending in a direction and connected with a corresponding active display area 210; and a second electrode lead 312, extending in another direction different from the direction in which the first electrode lead 311 and connecting the first electrode lead 311 with a corresponding pixel driving circuit 250. Thus, the distribution density of the bending electrode leads 310 can be reduced to prevent the bending electrode leads 210 from being concentrated to form a region with low light transmittance.

For example, in some examples, the K electrode leads are not overlapped with each other.

For example, in some examples, the extending direction of the first electrode lead 311 of the bending electrode leads 310 is the same as the row direction of the sub-region matrix, and the extending direction of the second electrode lead 312 of the bending electrode leads 310 is the same as the column direction of the sub-region matrix. However, the embodiments of the disclosure are not limited thereto. For example, the extending direction of the first electrode lead 311 of the bending electrode leads 310 is the same as the column direction of the sub-region matrix, and the extending direction of the second electrode lead 312 of the bending electrode leads 310 is the same as the row direction of the sub-region matrix.

For example, in some examples, as illustrated in FIG. 5A, the extending direction of the first electrode lead 311 is perpendicular to the extending direction of the second electrode lead 312.

For example, in some examples, as illustrated in FIG. 5A, each of the K electrode leads is the bending electrode lead 310.

Figure 6:
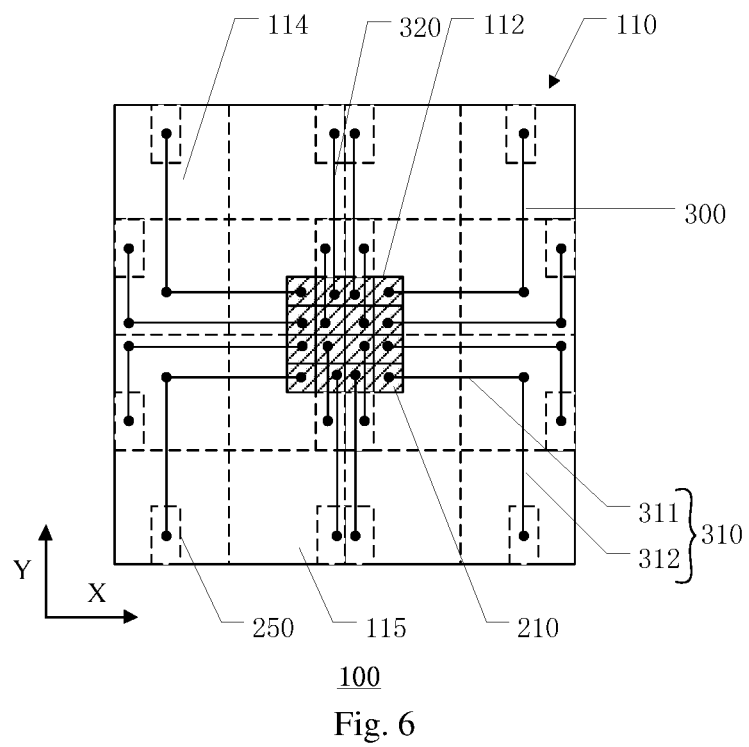
FIG. 6 is a planar view of another display panel provided by an embodiment of the present disclosure.

FIG. 6 is a planar view of another display panel provided by an embodiment of the present disclosure. As illustrated in FIG. 6, a portion of the K electrode leads 300 is the bending electrode lead 310. For example, as illustrated in FIG. 6, the K electrode leads 300 further comprises electrode leads extending in Y direction as illustrated in FIG. 6, so as to directly connect the active display areas to corresponding pixel driving circuits. Although the electrode leads extending in Y direction in the display panel are relatively concentrated, the pixel driving circuits are dispersed in the pixel region, signal lines connected to the pixel driving circuits are also uniformly distributed in the pixel region. Therefore, the display panel can still better avoid the formation of the abovementioned signal line concentrated region having poor light transmittance, and improve the uniformity of light transmittance in the pixel region, so as to eliminate the screen window effect, improve the display effect and enhance the user experience.

Figure 7:
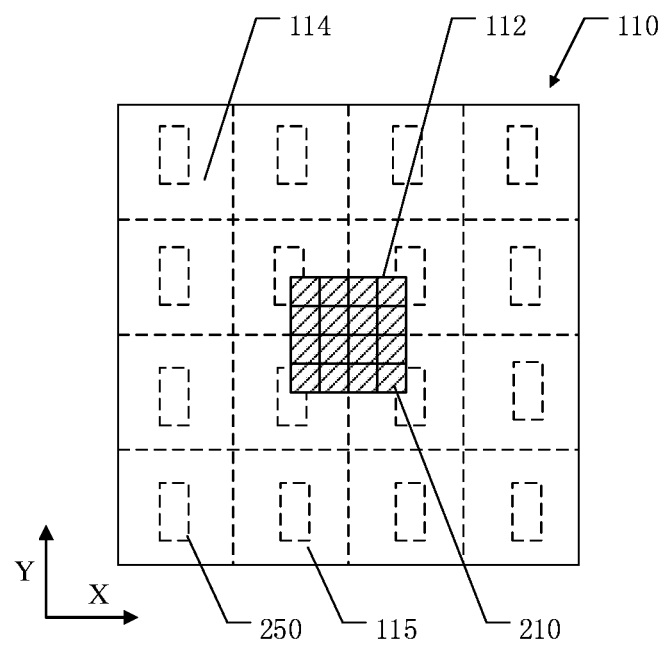
FIG. 7 is a planar view of another display panel provided by an embodiment of the present disclosure.

FIG. 7 is a planar view of another display panel provided by an embodiment of the present disclosure. As illustrated in FIG. 7, the display panel 100 differs from the display panel illustrated in FIG. 5A and FIG. 6 in that positions of the pixel driving circuits 250 in respective sub-regions 115 in the embodiment are the same. The position here refers to a relative position of the pixel driving circuit in the corresponding sub-region. For example, each pixel driving circuit 250 is disposed in the middle of the corresponding sub-region, the embodiment includes but is not limited thereto. For the display panel illustrated in FIG. 7, because the pixel driving circuits are uniformly distributed, the distribution of the first signal line and the second signal line may be more uniform. For simplicity, FIG. 7 does not illustrate the electrode leads between the active display areas and the pixel driving circuits, but corresponding electrode leads can be designed to perform corresponding electrical connections.

Figure 8:
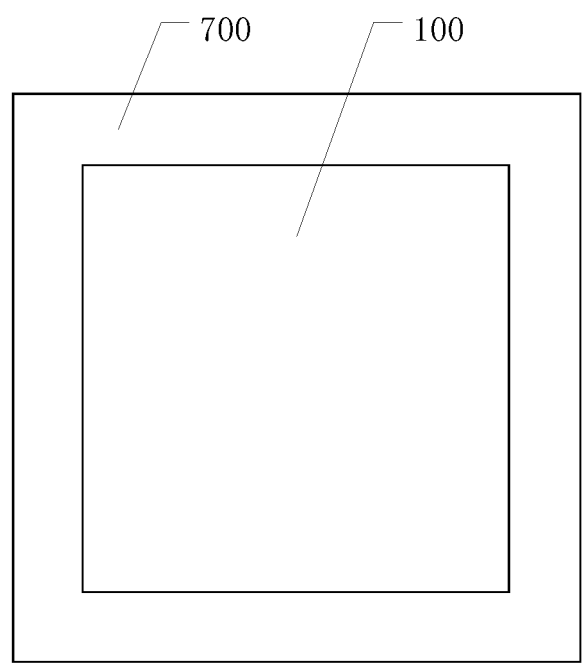
FIG. 8 is a schematic view of a display device provided by an embodiment of the present disclosure.

An embodiment of the present disclosure further provides a display device. FIG. 8 is a schematic view of a display device provided by an embodiment of the present disclosure. As illustrated in FIG. 8, the display device 700 comprises a display panel 100, the display panel 100 can be any display panel as mentioned above.

In the display device provided by the present embodiment, each pixel region included in the display panel can be divided into a pixel island and a transparent region, the pixel island is provided with an active display area for emitting light and displaying, and the transparent region is not provided with the active display area, and is a light-transmitting region. Therefore, the pixel island of the display panel can be used to emit light and display, and the transparent region can transmit light, so that a user can observe a real scene on a side of the display panel away from the user. The display panel can be used in a field of augmented reality. The pixel region comprises the K sub-regions with approximately equal areas, the K pixel driving circuits are respectively disposed in the K sub-regions, therefore, the pixel driving circuits of the K active display areas in the pixel island of the pixel region are uniformly distributed in the pixel region, so that signal lines connected with the pixel driving circuits are also uniformly distributed in the pixel region, thereby avoiding the formation of the signal line concentrated region having poor light transmittance, and improving the uniformity of light transmittance in the pixel region, so as to eliminate the screen window effect, improve the display effect and enhance the user experience.

For example, in some examples, the display device can be any product or component with a display function such as a smart phone, a tablet computer, a television, a display, a notebook computer, a digital photo frame, a navigator and the like.

The following points should to be explained:

1) The drawings of at least one embodiment of the present disclosure only relate to the structure in the embodiment of the present disclosure, and other structures may be referenced to the usual design.

2) In the absence of conflict, the features of the same embodiment and the different embodiments ban be combined with each other.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display panel, comprising:
a plurality of pixel regions, each of the plurality of pixel regions comprising a pixel island and a transparent region located on a periphery of the pixel island,
wherein the pixel island comprises K active display areas, a distance between adjacent ones of the K active display areas in the pixel island is less than a distance between the pixel islands in adjacent ones of the plurality of pixel regions,
each of the plurality of pixel regions comprises K sub-regions with approximately equal areas, K pixel driving circuits are respectively disposed in the K sub-regions, the K pixel driving circuits are configured to respectively drive the K active display areas, and the K is an integer greater than or equal to 2,
wherein the distance between adjacent ones of the K active display regions in the pixel island is less than one third of the distance between the pixel islands in adjacent ones of the plurality of pixel regions.

2. The display panel according to claim 1, wherein, in the pixel island, the K active display areas are arranged in an array; and in each of the plurality of pixel regions, the K sub-regions are arranged in an array.

3. The display panel according to claim 2, wherein, in the pixel island, the K active display areas are arranged in a matrix of M*N, the K sub-regions are also arranged in a matrix of M*N, K=M*N, M and N are positive integers respectively, and at least one of M and N is greater than 1.

4. The display panel according to claim 1, wherein the pixel island is located in a center of a corresponding pixel region.

5. The display panel according to claim 1, wherein each of the K active display area comprises an active light emitting structure.

6. The display panel according to claim 1, wherein each of the plurality of pixel regions further comprises:
K electrode leads, electrically connecting the K active display areas and the K pixel driving circuits in the transparent region respectively.

7. The display panel according to claim 6, wherein the K electrode leads do not cross each other.

8. The display panel according to claim 6, wherein each of the K electrode leads comprises a bending electrode lead, the bending electrode lead comprises:
a first electrode lead, extending in a direction and connected with a corresponding active display area; and
a second electrode lead, extending in another direction different from the direction in which the first electrode lead extends and connecting the first electrode lead with a corresponding pixel driving circuit.

9. The display panel according to claim 8, wherein each of the K electrode leads is the bending electrode lead.

10. The display panel according to claim 1, wherein each of the plurality pixel regions further comprises: a first signal line and a second signal line connected with each of the K pixel driving circuits,
the first signal line comprises at least one of a gate line and a reset line, and the second signal line comprises at least one of a data line and a source line.

11. The display panel according to claim 10, wherein an extending direction of the first signal line and an extending direction of the second signal line cross each other.

12. The display panel according to claim 1, wherein each of the K pixel driving circuits is disposed in a position of a corresponding sub-region away from the pixel island.

13. The display panel according to claim 1, wherein an area of each of the K sub-regions is greater than that of each of the K pixel driving circuits.

14. The display panel according to claim 1, wherein each of the K pixel driving circuits comprises a thin film transistor.

15. The display panel according to claim 1, wherein the K pixel driving circuits are in the transparent region.

16. The display panel according to claim 1, wherein, in each of the plurality of pixel regions, positions of the K pixel driving circuits in corresponding sub-pixel regions are the same.

17. The display panel according to claim 1, wherein, in the plurality of pixel regions, adjacent ones of the plurality of pixel regions are connected to each other so that the plurality of pixel regions are closely arranged.

18. The display panel according to claim 1, wherein the pixel island partially overlaps with the sub-pixel regions adjacent to the pixel island.

19. A display device, comprising the display panel according to claim 1.

* * * * *